US012760142B2

(12) United States Patent
Hashimoto et al.

(10) Patent No.: US 12,760,142 B2
(45) Date of Patent: Oct. 13, 2026

(54) COMPOSITION FOR FORMING RESIST UNDERLAYER FILM

(71) Applicant: NISSAN CHEMICAL CORPORATION, Tokyo (JP)

(72) Inventors: Yuto Hashimoto, Toyama (JP); Shun Kubodera, Toyama (JP); Shigetaka Otagiri, Toyama (JP); Satoshi Kamibayashi, Toyama (JP); Tokio Nishita, Toyama (JP); Yuichi Goto, Toyama (JP); Yasunobu Someya, Toyama (JP); Yuki Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/782,246

(22) PCT Filed: Nov. 26, 2020

(86) PCT No.: PCT/JP2020/044039
§ 371 (c)(1),
(2) Date: Jun. 3, 2022

(87) PCT Pub. No.: WO2021/111977
PCT Pub. Date: Jun. 10, 2021

(65) Prior Publication Data
US 2023/0029997 A1 Feb. 2, 2023

(30) Foreign Application Priority Data
Dec. 4, 2019 (JP) ................................ 2019-219651

(51) Int. Cl.
*C08G 59/26* (2006.01)
*C08G 59/40* (2006.01)
*C08G 59/42* (2006.01)
*C09D 163/00* (2006.01)
*G03F 7/11* (2006.01)

(52) U.S. Cl.
CPC ......... *C08G 59/26* (2013.01); *C08G 59/4021* (2013.01); *C08G 59/4207* (2013.01); *C08G 59/423* (2013.01); *C09D 163/00* (2013.01); *G03F 7/11* (2013.01)

(58) Field of Classification Search
None
See application file for complete search history.

(56) References Cited

U.S. PATENT DOCUMENTS

2012/0252218 A1 10/2012 Kori et al.
2013/0171569 A1 7/2013 Tachibana et al.
2014/0170567 A1* 6/2014 Sakamoto ................. G03F 7/11 523/400
2014/0220783 A1 8/2014 Koumura et al.
2016/0229940 A1* 8/2016 Hatakeyama ......... C08F 228/02
2018/0284614 A1 10/2018 Satoh et al.
2019/0041752 A1 2/2019 Tachibana et al.

FOREIGN PATENT DOCUMENTS

| | | | |
|---|---|---|---|
| JP | 2017-116803 | A | 6/2017 |
| JP | 2018-173521 | A | 11/2018 |
| TW | 201302691 | A1 | 1/2013 |
| TW | 201321901 | A1 | 6/2013 |
| TW | 201348884 | A1 | 12/2013 |
| TW | 201910420 | A1 | 3/2019 |
| WO | WO 2005/098542 | A1 | 10/2005 |
| WO | WO 2011/004721 | A1 | 1/2011 |
| WO | WO 2013/018802 | A1 | 2/2013 |

OTHER PUBLICATIONS

International Search Report, issued in PCT/JP2020/044039, PCT/ISA/210, dated Jan. 26, 2021.
Written Opinion of the International Searching Authority, issued in PCT/JP2020/044039, PCT/ISA/237, dated Jan. 26, 2021.
Taiwanese Office Action and Search Report for corresponding Taiwanese Application No. 109142575, dated Feb. 26, 2024.

* cited by examiner

*Primary Examiner* — Megan McCulley
(74) *Attorney, Agent, or Firm* — Birch, Stewart, Kolasch & Birch, LLP

(57) ABSTRACT

Provided is a composition which is for forming a resist underlayer film and with which the amount of a sublimate derived from a low-molecular-weight component such as an oligomer can be reduced, the composition comprising, for example, an organic solvent and a polymer having a repeating unit represented by formula (1-1), wherein the content of a low-molecular-weight component having a weight average molecular weight of 1,000 or less is 10 mass % or less in the polymer.

(1-1)

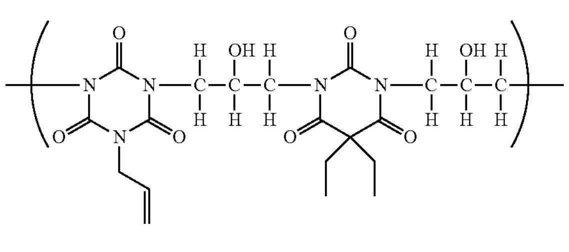

11 Claims, No Drawings

COMPOSITION FOR FORMING RESIST UNDERLAYER FILM

TECHNICAL FIELD

The present invention relates to a composition for forming resist underlayer film, and more particularly to a composition for forming resist underlayer film containing a condensation polymer obtained by reacting a monomer containing a pyrimidinetrione structure or a triazinetrione structure.

BACKGROUND ART

Conventionally, as the method for producing the condensation polymer, a method for reacting monoallyl diglycidyl isocyanuric acid with 5,5-diethylbarbituric acid is known. For example, Example of Synthesis 1 of Patent Document 1 and Patent Document 2 describes that the above compounds and benzyltriethylammonium chloride are dissolved in propylene glycol monomethyl ether, followed by reacting at 130° C. for 24 hours to obtain a solution containing a polymer having a weight average molecular weight of 6,800.

Patent Document 1 and Patent Document 2 further describe that an antireflection film-forming composition or a resist underlayer film-forming composition for EUV lithography is prepared using the obtained solution containing the polymer.

A polymer obtained by chemical synthesis is usually an aggregate of molecules having different molecular weights (polymerization degrees), and the molecular weight of such a polymer is represented by an average molecular weight such as a weight average molecular weight Mw or a numerical average molecular weight Mn. Therefore, as the content of a low molecular weight component in the polymer is higher, the average molecular weight of the polymer is lower, and the polydispersity (Mw/Mn) thereof is higher.

However, since the polymer obtained by the synthesis method described in Patent Document 1 and Patent Document 2 contains a large amount of low molecular weight components, there is a problem that a large amount of sublimates derived from the low molecular weight components are generated when the antireflection film-forming composition prepared or the resist underlayer film-forming composition for EUV lithography using the polymer is applied onto a substrate and baked to form a film. This sublimate causes contamination of the inside of a baking apparatus, specifically, a top plate immediately above a heating plate on which the substrate is placed, and the inside of an exhaust duct. When the inside of the baking apparatus is contaminated by the sublimate, it is necessary to clean the inside of the apparatus each time, and thus, from the viewpoint of improving the productivity, the reduction of the generation amount of the sublimate is strongly required.

PRIOR ART DOCUMENTS

Patent Documents

Patent Document 1: WO 2005/098542
Patent Document 2: WO 2013/018802

SUMMARY OF INVENTION

Technical Problem

The present invention has been made in view of the above circumstances, and an object of the present invention is to provide a composition for forming resist underlayer film that can reduce the generation amount of a sublimate derived from a low molecular weight component such as an oligomer.

Solution to Problem

As a result of intensive studies to solve the above problems, the present inventors have found that by setting the content of a low molecular weight component having a weight average molecular weight of 1,000 or less in a polymer contained in a composition for forming resist underlayer film to 10 wt % or less, the amount of a sublimate generated during the formation of a resist underlayer film can be reduced, and have completed the present invention.

That is, the present invention provides the following composition for forming resist underlayer film.

1. A composition for forming resist underlayer film comprising: a polymer having a repeating unit having the following formula (1); and an organic solvent, wherein a content of a low molecular weight component having a weight average molecular weight of 1,000 or less in the polymer is 10 wt % or less:

[Chem. 1]

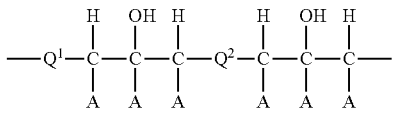

(1)

wherein As in the formula (1) each independently represent a hydrogen atom, a methyl group, or an ethyl group, and $Q^1$ and $Q^2$ represent the formula (2) or the formula (3):

[Chem. 2]

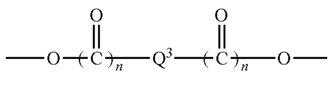

(2)

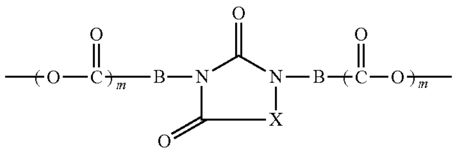

(3)

wherein $Q^3$ represents an alkylene group having 1 to 10 carbon atoms which may contain a sulfide bond or a disulfide bond, an alkenylene group having 2 to 10 carbon atoms, a phenylene group, a naphthylene group, or an anthrylene group; the phenylene group, the naphthylene group, and the anthrylene group may be each independently substituted with a substituent selected from the group consisting of an alkyl group having 1 to 6 carbon atoms, a phenyl group, a halogen atom, an alkoxy group having 1 to 6 carbon atoms, a nitro group, a cyano group, a hydroxy group, and an alkylthio group having 1 to 6 carbon atoms; Bs each independently represent a single bond or an alkylene group having 1 to 5 carbon atoms; ns are each independently 0 or 1; ms are each independently 0 or 1; and X represents the formula (4) or the formula (5):

[Chem. 3]

(4)

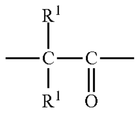

(5)

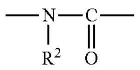

wherein $R^1$s each independently represent a hydrogen atom, a halogen atom, an alkyl group having 1 to 6 carbon atoms, an alkenyl group having 3 to 6 carbon atoms, a benzyl group, or a phenyl group; the alkyl group and the alkenyl group may be substituted with a halogen atom, a hydroxy group, or a cyano group; in the benzyl group, a hydrogen atom on an aromatic ring may be substituted with a hydroxy group; the phenyl group may be substituted with a substituent selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms; two $R^1$s may be bonded to each other to form a ring having 3 to 6 carbon atoms; $R^2$ represents a halogen atom, an alkyl group having 1 to 6 carbon atoms, an alkenyl group having 3 to 6 carbon atoms, a benzyl group, or a phenyl group; and the phenyl group may be substituted with a substituent selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms; and at least one of $Q^1$ and $Q^2$ contains a structure having the formula (3).

2. The composition for forming resist underlayer film according to claim 1, further comprising a crosslinking agent.

3. The composition for forming resist underlayer film according to claim 1 or 2, further comprising an acid catalyst.

4. A resist underlayer film obtained from the composition for forming resist underlayer film according to any one of claims 1 to 3.

5. A polymer having a repeating unit having the following formula (1), wherein a content of a low molecular weight component having a weight average molecular weight of 1,000 or less in the polymer is 10 wt % or less:

[Chem. 4]

(1)

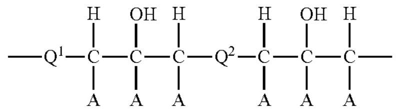

wherein As in the formula (1) each independently represent a hydrogen atom, a methyl group, or an ethyl group, and $Q^1$ and $Q^2$ represent the formula (2) or the formula (3):

[Chem. 5]

(2)

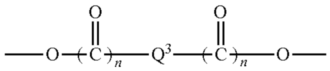

(3)

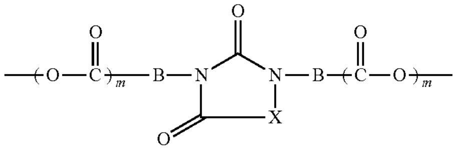

wherein $Q^3$ represents an alkylene group having 1 to 10 carbon atoms which may contain a sulfide bond or a disulfide bond, an alkenylene group having 2 to 10 carbon atoms, a phenylene group, a naphthylene group, or an anthrylene group; the phenylene group, the naphthylene group, and the anthrylene group may be each independently substituted with a substituent selected from the group consisting of an alkyl group having 1 to 6 carbon atoms, a phenyl group, a halogen atom, an alkoxy group having 1 to 6 carbon atoms, a nitro group, a cyano group, a hydroxy group, and an alkylthio group having 1 to 6 carbon atoms; Bs each independently represent a single bond or an alkylene group having 1 to 5 carbon atoms; ns are each independently 0 or 1; ms are each independently 0 or 1; and X represents the formula (4) or the formula (5):

[Chem. 6]

(4)

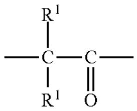

(5)

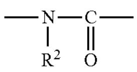

wherein $R^1$s each independently represent a hydrogen atom, a halogen atom, an alkyl group having 1 to 6 carbon atoms, an alkenyl group having 3 to 6 carbon atoms, a benzyl group, or a phenyl group; the alkyl group and the alkenyl group may be substituted with a halogen atom, a hydroxy group, or a cyano group; in the benzyl group, a hydrogen atom on an aromatic ring may be substituted with a hydroxy group; the phenyl group may be substituted with a substituent selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms; two $R^1$s may be bonded to each other to form a ring having 3 to 6 carbon atoms; $R^2$ represents a halogen atom, an alkyl group having 1 to 6 carbon atoms, an alkenyl group having 3 to 6 carbon atoms, a benzyl group, or a phenyl group; and the phenyl group may be substituted with a substituent selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms; and at least one of $Q^1$ and $Q^2$ contains a structure having the formula (3).

Advantageous Effects of Invention

A composition for forming resist underlayer film according to the present invention suppresses the generation of a sublimate during the formation of a resist underlayer film, so that the frequency of cleaning the inside of an apparatus can be reduced, which can contribute to improvement in the productivity of the resist underlayer film.

DESCRIPTION OF EMBODIMENTS

A composition for forming resist underlayer film according to the present invention contains a polymer having a repeating unit represented by the following formula (1) and an organic solvent, and the content of a low molecular weight component having a weight average molecular weight (hereinafter, referred to as Mw) of 1,000 or less in the polymer is 10 wt % or less. In the present invention, the low molecular weight component means a polymer having a repeating unit represented by the formula (1) such as an oligomer and having an Mw not exceeding 1,000, and is free of an unreacted monomer component or other components such as a catalyst used in a polymerization reaction. In the present invention, the Mw is a value in terms of polystyrene measured by gel permeation chromatography (GPC).

[Chem. 7]

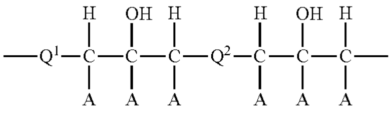

(1)

In the formula, As each independently represent a hydrogen atom, a methyl group, or an ethyl group, and $Q^1$ and $Q^2$ represent the formula (2) or the formula (3).

[Chem. 8]

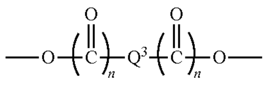

(2)

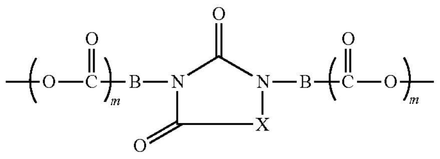

(3)

In the formula, $Q^3$ represents an alkylene group having 1 to 10 carbon atoms which may contain a sulfide bond or a disulfide bond, an alkenylene group having 2 to 10 carbon atoms, a phenylene group, a naphthylene group, or an anthrylene group. The phenylene group, the naphthylene group, and the anthrylene group may be each independently substituted with a substituent selected from the group consisting of an alkyl group having 1 to 6 carbon atoms, a phenyl group, a halogen atom, an alkoxy group having 1 to 6 carbon atoms, a nitro group, a cyano group, a hydroxy group, and an alkylthio group having 1 to 6 carbon atoms.

Bs each independently represent a single bond or an alkylene group having 1 to 5 carbon atoms.

ns are each independently 0 or 1.

ms are each independently 0 or 1.

X is a substituent represented by the formula (4) or the formula (5).

[Chem. 9]

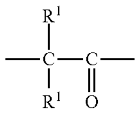

(4)

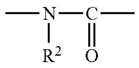

(5)

In the formula, $R^1$s each independently represent a hydrogen atom, a halogen atom, an alkyl group having 1 to 6 carbon atoms, an alkenyl group having 3 to 6 carbon atoms, a benzyl group, or a phenyl group. The alkyl group and the alkenyl group may be substituted with a halogen atom, a hydroxy group, or a cyano group. In the benzyl group, a hydrogen atom on an aromatic ring may be substituted with a hydroxy group. The phenyl group may be substituted with a substituent selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms, and two $R^1$s may be bonded to each other to form a ring having 3 to 6 carbon atoms.

$R^2$ represents a halogen atom, an alkyl group having 1 to 6 carbon atoms, an alkenyl group having 3 to 6 carbon atoms, a benzyl group, or a phenyl group. The phenyl group may be substituted with a substituent selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms.

At least one of $Q^1$ and $Q^2$ contains a structure represented by the formula (3).

The alkylene group having 1 to 10 carbon atoms may be linear, branched, or cyclic, and examples thereof include methylene, ethylene, propylene, pentamethylene, cyclohexylene, 2-methylpropylene, and 1-methylethylidene groups. Examples of the alkylene group having 1 to 10 carbon atoms which contains a sulfide bond or a disulfide bond include an alkylene group containing a sulfide bond or a disulfide bond represented by the following formula.

[Chem. 10]

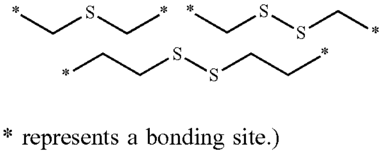

(wherein * represents a bonding site.)

The alkenylene group having 2 to 10 carbon atoms may be linear, branched, or cyclic, and examples thereof include ethenylene, propenylene, butenylene, pentenylene, hexenylene, heptenylene, octenylene, and nonenylene groups.

The alkyl group having 1 to 6 carbon atoms may be linear, branched, or cyclic, and examples thereof include methyl, ethyl, n-propyl, i-propyl, n-butyl, i-butyl, t-butyl, n-pentyl, i-pentyl, neopentyl, n-hexyl, cyclopentyl, and cyclohexyl groups.

The alkoxy group having 1 to 6 carbon atoms may be linear, branched, or cyclic, and examples thereof include methoxy, ethoxy, i-propoxy, n-pentyloxy, n-hexyloxy, and cyclohexyloxy groups.

The alkylthio group having 1 to 6 carbon atoms may be linear, branched, or cyclic, and examples thereof include methylthio, ethylthio, i-propylthio, n-pentylthio, and cyclohexylthio groups.

Examples of the halogen atom include a fluorine atom, a chlorine atom, a bromine atom, and an iodine atom.

Examples of a ring having 3 to 6 carbon atoms formed by bonding two $R^1$s include a cyclobutane ring, a cyclopentane ring, and a cyclohexane ring.

In the present invention, Mw is a value in terms of polystyrene measured by gel permeation chromatography (GPC).

Examples of the repeating unit represented by the formula (1) include, but are not limited to, those represented by the following formulae (1-1) to (1-4).

[Chem. 11]

(1-1)

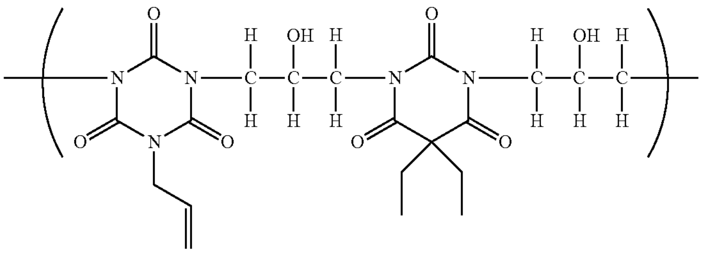

(1-2)

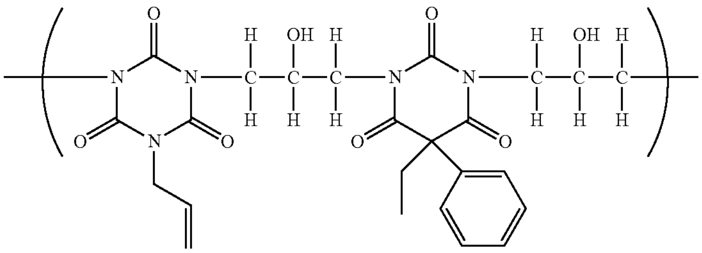

(1-3)

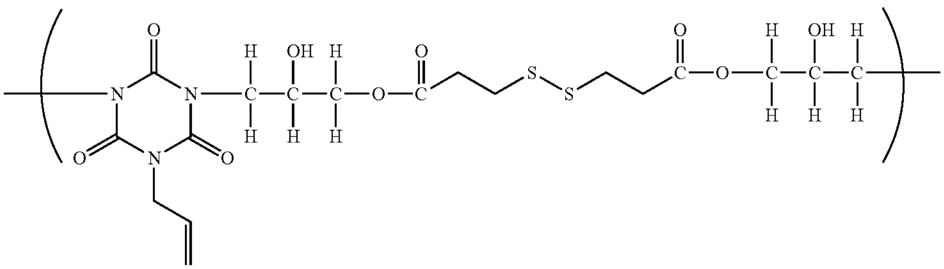

(1-4)

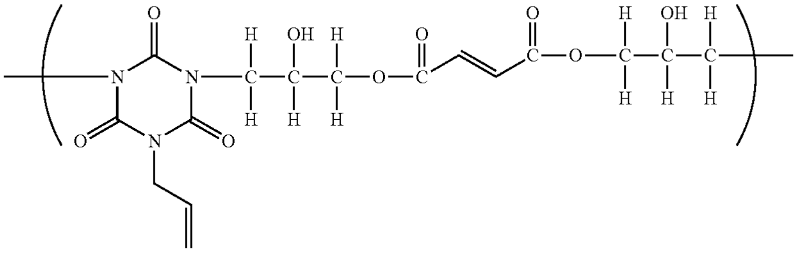

The content of the low molecular weight component having an Mw of 1,000 or less in the polymer is 10 wt % or less, but is preferably 5 wt % or less, more preferably 3 wt % or less, and still more preferably 1 wt % or less from the viewpoint of further reducing the generation amount of a sublimate.

The Mw of the polymer is preferably 1,000 to 200,000, more preferably 2,000 to 100,000, still more preferably 3,000 to 50,000, still more preferably 4,000 to 30,000, and most preferably 5,000 to 20,000 in consideration of coatability in preparing a coating film, and the polydispersity Mw/Mn of the polymer is preferably 10.5 or less, and more preferably 2.1 or less (Mn represents a numerical average molecular weight measured under the same conditions as those of Mw; the same applies hereinafter).

The polymer having a reduced low molecular weight component content as described above can be synthesized by a method including the following first step and second step. In the following description, a crude polymer means a polymer synthesized in the first step, and a purified polymer means a polymer obtained from a solution containing the crude polymer through the second step.

<First Step>

The first step is a step of reacting a monomer represented by the following formula (a) (hereinafter, may be abbreviated as a component (a)) and a monomer represented by the following formula (b) (hereinafter, may be abbreviated as a component (b)) in the presence of a quaternary phosphonium salt or a quaternary ammonium salt in an organic solvent to synthesize a crude polymer having a repeating unit represented by the following formula (1).

[Chem. 12]

(1)

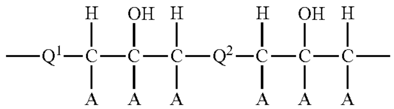

(a)

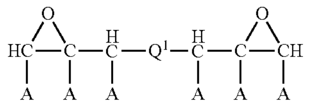

(b)

$$H-Q^2-H$$

In the formula, A, $Q^1$, and $Q^2$ are as described above.

Specific examples of the component (a) include the following.

Examples of a compound in which $Q^1$ is a substituent represented by the formula (2) include a diglycidyl ester compound and a diglycidyl ether compound.

Examples of the diglycidyl ester compound include terephthalic acid diglycidyl ester, isophthalic acid diglycidyl ester, phthalic acid diglycidyl ester, 2,5-dimethylterephthalic acid diglycidyl ester, 2,5-diethylterephthalic acid diglycidyl ester, 2,3,5,6-tetrachloroterephthalic acid diglycidyl ester, 2,3,5,6-tetrabromoterephthalic acid diglycidyl ester, 2-nitroterephthalic acid diglycidyl ester, 2,3,5,6-tetrafluoroterephthalic acid diglycidyl ester, 2,5-dihydroxyterephthalic acid diglycidyl ester, 2,6-dimethylterephthalic acid diglycidyl ester, 2,5-dichloroterephthalic acid diglycidyl ester, 2,3-dichloroisophthalic acid diglycidyl ester, 3-nitroisophthalic acid diglycidyl ester, 2-bromoisophthalic acid diglycidyl ester, 2-hydroxyisophthalic acid diglycidyl ester, 3-hydroxyisophthalic acid diglycidyl ester, 2-methoxyisophthalic acid diglycidyl ester, 5-phenylisophthalic acid diglycidyl ester, 3-nitrophthalic acid diglycidyl ester, 3,4,5,6-tetrachlorophthalic acid diglycidyl ester, 4,5-dichlorophthalic acid diglycidyl ester, 4-hydroxyphthalic acid diglycidyl ester, 4-nitrophthalic acid diglycidyl ester, 4-methylphthalic acid diglycidyl ester, 3,4,5,6-tetrafluorophthalic acid diglycidyl ester, 2,6-naphthalenedicarboxylic acid diglycidyl ester, 1,2-naphthalenedicarboxylic acid diglycidyl ester, 1,4-naphthalenedicarboxylic acid diglycidyl ester, 1,8-naphthalenedicarboxylic acid diglycidyl ester, anthracene-9,10-dicarboxylic acid diglycidyl ester, 1,2-cyclohexanedicarboxylic acid diglycidyl ester, dithiodiglycolic acid diglycidyl ester, 2,2'-thiodiglycolic acid diglycidyl ester, and diglycolic acid diglycidyl ester.

Examples of the diglycidyl ether compound include ethylene glycol diglycidyl ether, 1,3-propanediol diglycidyl ether, 1,4-butanediol diglycidyl ether, 1,5-pentanediol diglycidyl ether, 1,6-hexanediol diglycidyl ether, 1,2-benzenediol diglycidyl ether, 1,3-benzenediol diglycidyl ether, 1,4-benzenediol diglycidyl ether, and 1,6-naphthalenediol diglycidyl ether.

Examples of a compound in which $Q^1$ is a substituent represented by the formula (3) include a diglycidyl barbituric acid compound and a diglycidyl isocyanuric acid compound.

Examples of the diglycidyl barbituric acid compound include 1,3-diglycidyl-5,5-diethylbarbituric acid, 1,3-diglycidyl-5-phenyl-5-ethylbarbituric acid, 1,3-diglycidyl-5-ethyl-5-isoamylbarbituric acid, 1,3-diglycidyl-5-allyl-5-isobutylbarbituric acid, 1,3-diglycidyl-5-allyl-5-isopropylbarbituric acid, 1,3-diglycidyl-5-O-bromoallyl-5-sec-butylbarbituric acid, 1,3-diglycidyl-5-ethyl-5-(1-methyl-1-butenyl)barbituric acid, 1,3-diglycidyl-5-isopropyl-5-O-bromoallylbarbituric acid, 1,3-diglycidyl-5-(1-cyclohexyl)-5-ethylmalonylurea, 1,3-diglycidyl-5-ethyl-5-(1-methylbutyl)malonylurea, 1,3-diglycidyl-5,5-diallylmalonylureaziglycidyl, and 1,3-diglycidyl-5-ethyl-5-n-butylbarbituric acid.

Examples of the diglycidyl isocyanuric acid compound include monoallyl diglycidyl isocyanuric acid, monomethyl diglycidyl isocyanuric acid, monoethyl diglycidyl isocyanuric acid, monopropyl diglycidyl isocyanuric acid, monomethyl thiomethyl diglycidyl isocyanuric acid, monoisopropyl diglycidyl isocyanuric acid, monomethoxy methyl diglycidyl isocyanuric acid, monobutyl diglycidyl isocyanuric acid, monomethoxy ethoxy methyl diglycidyl isocyanuric acid, monophenyl diglycidyl isocyanuric acid, monobromo diglycidyl isocyanuric acid, monoallyl isocyanuric acid diglycidyl ester, and monomethyl isocyanuric acid diglycidyl ester.

Specific examples of the component (b) include the following.

Examples of a compound in which $Q^2$ is a substituent represented by the formula (2) include a dicarboxylic acid compound.

Examples of the dicarboxylic acid compound include terephthalic acid, isophthalic acid, phthalic acid, 2,5-dimethylterephthalic acid, 2,5-diethylterephthalic acid, 2,3,5,6-tetrachloroterephthalic acid, 2,3,5,6-tetrabromoterephthalic acid, 2 nitroterephthalic acid, 2,3,5,6-tetrafluoroterephthalic acid, 2,5-dihydroxyterephthalic acid, 2,6-dimethylterephthalic acid, 2,5-dichloroterephthalic acid, 2,3-dichloroisophthalic acid, 3-nitroisophthalic acid, 2-bromoisophthalic acid, 2-hydroxyisophthalic acid, 3 hydroxyisophthalic acid, 2-methoxyisophthalic acid, 5-phenylisophthalic acid, 3 nitrophthalic acid, 3,4,5,6-tetrachlorophthalic acid, 4,5-dichlorophthalic acid, 4 hydroxyphthalic acid, 4-nitrophthalic acid, 4-methylphthalic acid, 3,4,5,6 tetrafluorophthalic acid, 2,6-naphthalenedicarboxylic acid, 1,2 naphthalenedicarboxylic acid, 1,4-naphthalenedicarboxylic acid, 1,8 naphthalenedicarboxylic acid, anthracene-9,10-dicarboxylic acid, ethylene glycol, 1,3 propanedicarboxylic acid, 4-hydroxybenzoic acid, fumaric acid, dithiodiglycolic acid, 2,2'-thiodiglycolic acid, tartaric acid, malonic acid, succinic acid, glutaric acid, adipic acid, itaconic acid, 3,3'-(5-methyl)-2,4,6-trioxo-1,3,5-triazine-1,3-diyl dipropionic acid, and 3,3'-dithiodipropionic acid.

Examples of a compound in which $Q^2$ is a substituent represented by the formula (3) include a barbituric acid compound and an isocyanuric acid compound.

Examples of the barbituric acid compound include barbituric acid, 5,5-dimethylbarbituric acid, 5,5-diethylbarbituric acid (also referred to as barbital), 5-methyl-5-ethylbarbituric acid, 5,5-diallylbarbituric acid (also referred to as allobarbital), 5-ethyl-5-phenylbarbituric acid (also referred to as phenobarbital), 5-ethyl-5-isopentylbarbituric acid (also referred to as amobarbital), 5,5-diallylmalonylurea, 5-ethyl-5-isoamylbarbituric acid, 5-allyl-5-isobutylbarbituric acid, 5-allyl-5-isopropylbarbituric acid, 5-O-bromoallyl-5-sec-butylbarbituric acid, 5-ethyl-5-(1-methyl-1-butenyl)barbituric acid, 5-isopropyl-5-O-bromoallyl barbituric acid, 5-(1-cyclohexyl)-5-ethyl malonylurea, 5-ethyl-5-(1-methylbutyl) malonylurea, 5,5-dibromo barbituric acid, 5-phenyl-5-ethyl barbituric acid, and 5-ethyl-5-normal butyl barbituric acid.

Examples of the isocyanuric acid compound include monoallyl isocyanuric acid, monomethyl isocyanuric acid, monoethyl isocyanuric acid, monopropyl isocyanuric acid, monoisopropyl isocyanuric acid, monophenyl isocyanuric acid, monobenzyl isocyanuric acid, and monochloro isocyanuric acid.

Any one compound selected from the component (a) exemplified above and any one compound selected from the component (b) exemplified above can be usually combined, but the combination is not limited thereto. A plurality of compounds selected for any one or both of the component (a) and the component (b) may be used. However, at least one of the component (a) and the component (b) contains a compound having any skeleton selected from barbituric acid and isocyanuric acid.

Examples of the component (a) that can be suitably used in the present invention include, but are not limited to, the following compounds.

[Chem. 13]

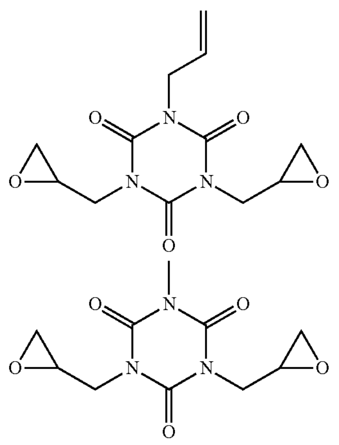

-continued

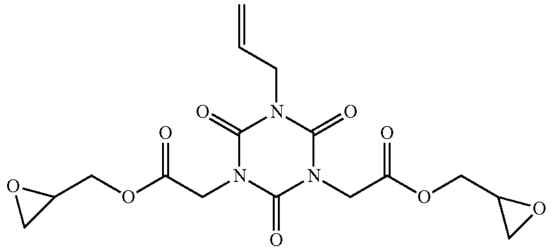

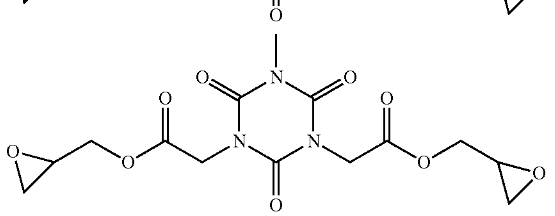

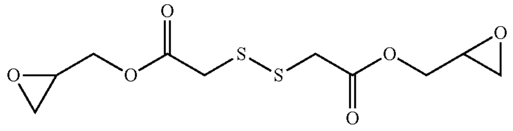

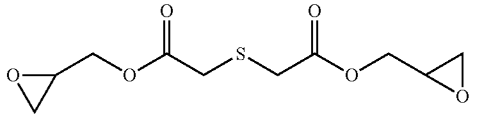

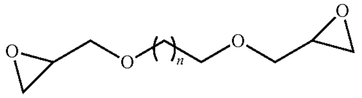

n = 1~10

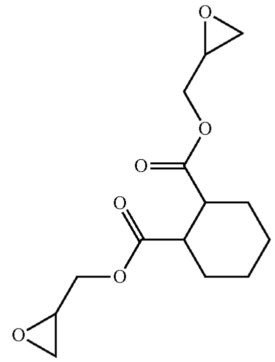

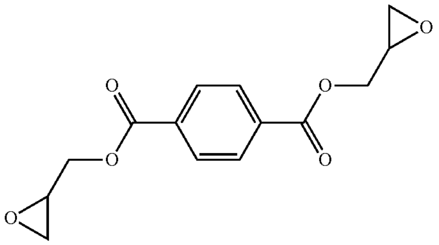

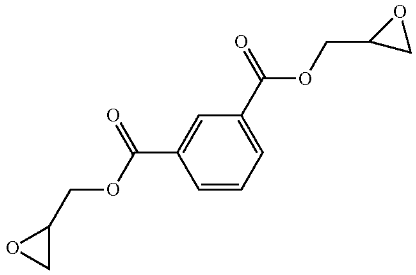

-continued

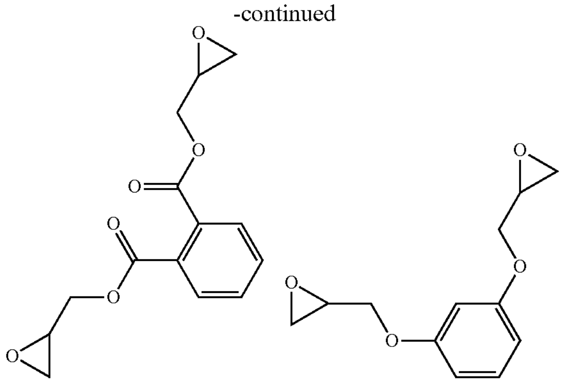

Examples of the component (b) that can be suitably used in the present invention include, but are not limited to, the following compounds.

[Chem. 14]

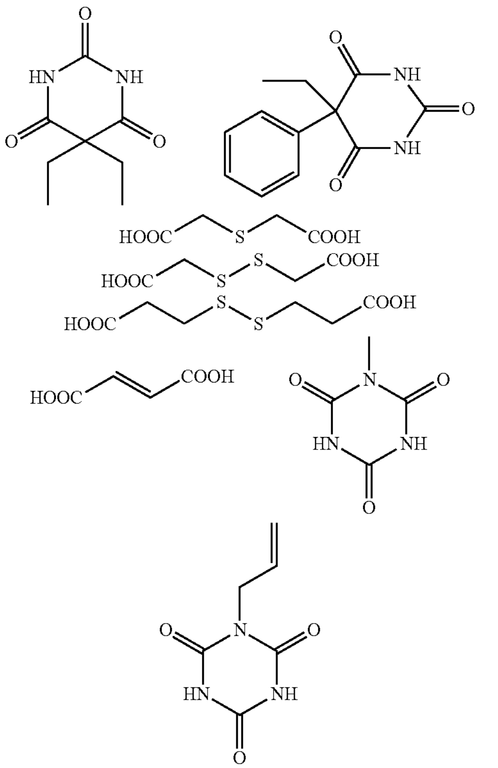

The compounding ratio (molar ratio) of the component (a) and the component (b) is not particularly limited, but from the viewpoint of suppressing the residual of the unreacted component (a) having an epoxy group, it is preferable that the component (a) and the component (b) are equimolar, or the component (b) is excessive per the component (a), and it is more preferable that (a):(b)=1:1.21 to 1:1 is set. By setting the compounding ratio to be equal to or less than the upper limit, a polymer having a desired Mw is easily obtained.

Examples of the quaternary phosphonium salt include methyltriphenylphosphonium bromide, ethyltriphenylphosphonium bromide, butyltriphenylphosphonium bromide, hexyltriphenylphosphonium bromide, tetrabutylphosphonium bromide, benzyltriphenylphosphonium bromide, methyltriphenylphosphonium chloride, ethyltriphenylphosphonium chloride, butyltriphenylphosphonium chloride, hexyltriphenylphosphonium chloride, tetrabutylphosphonium chloride, benzyltriphenylphosphonium chloride, methyltriphenylphosphonium iodide, ethyltriphenylphosphonium iodide, butyltriphenylphosphonium iodide, hexyltriphenylphosphonium iodide, tetrabutylphosphonium iodide, and benzyltriphenylphosphonium iodide. In the present invention, ethyltriphenylphosphonium bromide and tetrabutylphosphonium bromide can be suitably used.

Examples of the quaternary ammonium salt include tetramethylammonium fluoride, tetramethylammonium chloride, tetramethylammonium bromide, tetramethylammonium nitrate, tetramethylammonium sulfate, tetramethylammonium acetate, tetraethylammonium chloride, tetraethylammonium bromide, tetrapropylammonium chloride, tetrapropylammonium bromide, tetrabutylammonium fluoride, tetrabutylammonium chloride, tetrabutylammonium bromide, benzyltrimethylammonium chloride, phenyltrimethylammonium chloride, benzyltriethylammonium chloride, methyltributylammonium chloride, benzyltributylammonium chloride, and methyltrioctylammonium chloride. In the present invention, benzyltriethylammonium chloride can be suitably used.

The compounding amounts of the quaternary phosphonium salt and the quaternary ammonium salt are not particularly limited as long as the compounding amounts cause the reaction to proceed, but are preferably 0.1 to 10.0%, and more preferably 1.0 to 5.0% per the number of moles of the component (a).

The organic solvent used in the first step may be any solvent that does not affect the reaction, and examples thereof include benzene, toluene, xylene, ethyl lactate, butyl lactate, propylene glycol monomethyl ether, propylene glycol monomethyl ether acetate, cyclohexanone, and N-methylpyrrolidone. These can be used singly or in combination of two or more kinds thereof. In the present invention, propylene glycol monomethyl ether is preferable in consideration of the use of the composition using the finally obtained polymer.

The use amount of the organic solvent can be appropriately set according to the type and use amount of the components described above, and is not particularly limited. In the present invention, in consideration of causing the reaction to efficiently proceed, the total solid content concentration of the components is preferably 5 to 40 wt %, more preferably 10 to 30 wt %, and still more preferably 15 to 25 wt %. Here, the solid content of the solid content concentration of the solution means components other than the solvent constituting the solution.

A reaction temperature in the first step is usually 200° C. or lower, and is preferably 150° C. or lower, and more preferably 130° C. or lower in consideration of the boiling point of the organic solvent to be used. The lower limit of the reaction temperature is not particularly limited, but is preferably 50° C. or higher, and more preferably 60° C. or higher in consideration of rapidly completing the condensation reaction of the component (a) and the component (b). During heating, reflux may be performed.

A reaction time cannot be generally defined because it depends on the reaction temperature and the reactivity of a raw material substance, but the reaction time is usually about 1 to 48 hours, and when the reaction temperature is 60 to 130° C., the reaction time is about 15 to 30 hours.

<Second Step>

The second step is a step of mixing a solution containing the crude polymer obtained in the first step (hereinafter, a crude polymer solution) with a poor solvent to precipitate the crude polymer having the repeating unit represented by the formula (1), and filtering the polymer, and the low molecular weight component contained in the crude polymer can be removed by the second step. Here, as the crude polymer solution, the reaction liquid obtained in the first step may be used as it is, or a solution obtained by dissolving a crude polymer isolated by appropriate means such as drying in an appropriate solvent may be used. In the latter case, the organic solvent used in the first step can be used as the solvent.

As the poor solvent used in the second step, a solvent that has a low polymer solubility and dissolves a low molecular weight component can be used, and examples thereof include diethyl ether, cyclopentyl methyl ether, diisopropyl ether, and isopropyl alcohol. These can be used singly or in combination of two or more kinds thereof. In the present invention, isopropyl alcohol can be suitably used.

In the present invention, when the crude polymer solution and the poor solvent are mixed, the mixing order thereof is not particularly limited, and the crude polymer solution may be added to the poor solvent, or the poor solvent may be added to the crude polymer solution, but a method for adding the crude polymer solution to the poor solvent is preferable in consideration of removing more low molecular weight components.

When the crude polymer solution and the poor solvent are mixed, gradual addition due to dropping or the like or collective addition of the whole amount thereof may be performed, but in consideration of reducing the content of the low molecular weight component in the purified polymer, gradual addition due to dropping or the like is preferable.

The amount of the poor solvent used in the crude polymer solution is not particularly limited as long as the low molecular weight component does not precipitate and the polymer can be sufficiently precipitated, but is preferably 2 to 30 mass times, more preferably 5 to 20 mass times, and still more preferably 5 to 15 mass times per the total mass of the crude polymer solution.

A temperature during mixing may be appropriately set within a range from the melting point of the solvent to be used to the boiling point of the solvent, and is not particularly limited, but may be usually about −20 to 50° C., and is preferably 0 to 50° C., and more preferably 0 to 30° C. in consideration of ease of formation of precipitation and workability.

Examples of a suitable aspect of the mixing operation include, but are not limited to, a method for gradually adding a crude polymer solution having a total solid content concentration of 5 to 50 wt % to a poor solvent of 5 to 20 mass times over 15 minutes to 1 hour per 50 g of the crude polymer solution.

After the mixing operation is completed, stirring may be continued for a predetermined time in order to remove more low molecular weight components. In this case, a stirring time is preferably 10 minutes to 2 hours, and more preferably 15 minutes to 1 hour.

In order to further reduce the polydispersity of the polymer, a step of dissolving the sediment filtered in the second step again in the organic solvent used in the first step, mixing the obtained solution with the poor solvent, and then filtering the generated sediment may be performed.

Through the second step, 30 wt % or more, preferably 40 wt % or more, more preferably 70 wt % or more, and still more preferably 90 wt % or more of the low molecular weight component contained in the crude polymer can be removed, and finally, a polymer (purified polymer) is obtained, in which the content of the low molecular weight component is 10 wt % or less, preferably 5 wt % or less, more preferably 3 wt % or less, and still more preferably 1 wt % or less.

The organic solvent can be used without particular limitation as long as the organic solvent can dissolve a solid content. In particular, since the composition for forming resist underlayer film according to the present invention is used in a uniform solution state, in consideration of the coating performance thereof, it is recommended to use a solvent generally used in a lithography step in combination.

Examples of the organic solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxy cyclopentane, anisole, γ-butyrolactone, N-methylpyrrolidone, N,N-dimethylformamide, and N,N-dimethylacetamide. These organic solvents may be used singly or in combination of two or more kinds thereof.

The solid content concentration of the composition for forming resist underlayer film of the present invention is appropriately set in consideration of the viscosity and surface tension and the like of the composition, and the thickness of a thin film to be prepared, and the like, but is usually about 0.1 to 20.0 wt %, preferably 0.5 to 15.0 wt %, and more preferably 1.0 to 10.0 wt %. The solid content of the solid content concentration in the composition as used herein means components other than the solvent contained in the composition for forming resist underlayer film of the present invention.

The composition for forming resist underlayer film of the present invention may contain optional components such as a crosslinking agent, an acid catalyst (organic acid) that accelerates a crosslinking reaction, a surfactant, a light absorber, a rheology modifier, and an adhesion aid as long as the effects of the present invention are not impaired.

The crosslinking agent is not particularly limited, but a compound having at least two crosslinking groups in its molecule can be suitably used. Examples thereof include melamine-based compounds and substituted urea-based compounds that have crosslinking groups such as a methylol group and a methoxymethyl group. Specifically, the compound is a compound such as methoxymethylated glycoluril or methoxymethylated melamine, and is, for example, tetramethoxymethylglycoluril, tetrabutoxymethylglycoluril, or hexamethoxymethylmelamine. Compounds such as tetramethoxymethyl urea and tetrabutoxymethyl urea can also be mentioned. These crosslinking agents can cause a crosslinking reaction due to self-condensation. The crosslinking agents can cause a crosslinking reaction with a hydroxyl group in the polymer having the structure represented by the formula (1). An underlayer film formed by such a crosslinking reaction becomes rigid. The underlayer film has a low solubility in an organic solvent. These crosslinking agents may be used singly or in combination of two or more kinds thereof.

When the composition for forming resist underlayer film contains the crosslinking agent, the content of the crosslinking agent varies depending on an organic solvent to be used, a base substrate to be used, a required solution viscosity, and a required film shape and the like, but is preferably 0.01 to 50 wt %, more preferably 0.1 to 40 wt %, and still more preferably 0.5 to 30 wt % in the solid content from the viewpoint of the curability of a coating film. These crosslinking agents may cause a crosslinking reaction due to self-condensation, but when crosslinkable substituents are present in the polymer of the present invention, the crosslinking agents can cause a crosslinking reaction with the crosslinkable substituents.

Examples of the acid catalyst include sulfonic acid compounds such as p-phenolsulfonic acid, p-toluenesulfonic acid, trifluoromethanesulfonic acid, and pyridinium-p-toluenesulfonate; carboxylic acid compounds such as salicylic acid, 5-sulfosalicylic acid, citric acid, benzoic acid, and hydroxybenzoic acid; acid compounds that generate an acid under the presence of heat or light, such as 2,4,4,6-tetrabromocyclohexadienone, benzoin tosylate, 2-nitrobenzyl tosylate, p-trifluoromethylbenzenesulfonic acid-2,4-dinitrobenzyl, phenyl-bis(trichloromethyl)-s-triazine, and N-hydroxysuccinimide trifluoromethanesulfonate; iodonium salt-based acid generators such as diphenyliodonium hexafluorophosphate, diphenyliodonium trifluoromethanesulfonate, and bis(4-tert-butylphenyl)iodonium trifluoromethanesulfonate; and sulfonium salt-based acid generators such as triphenylsulfonium hexafluoroantimonate and triphenylsulfonium trifluoromethanesulfonate. In the present invention, among these, sulfonic acid compounds and carboxylic acid compounds can be suitably used. The acid catalysts may be used singly or in combination of two or more kinds thereof.

When the composition for forming resist underlayer film contains the acid catalyst, the content thereof is preferably 0.0001 to 20 wt %, more preferably 0.01 to 15 wt %, and still more preferably 0.1 to 10 wt % in the solid content from the viewpoint of sufficiently accelerating the crosslinking reaction.

The surfactant is added for the purpose of further improving the coatability of the composition to the semiconductor substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP [registered trademark] EF301, EF303, and EF352 (manufactured by Mitsubishi Materials Electronic Chemicals Co., Ltd.), MEGAFACE [registered trademark] F171, F173, R-30, R-30N, R-40, and R-40-LM (manufactured by DIC Corporation), FLUORAD FC430 and FC431 (manufactured by 3M Japan Ltd.), and Asahi Guard [registered trademark] AG710, Surflon [registered trademark] S-382, SC101, SC102, SC103, SC104, SC105, and SC106 (manufactured by AGC Inc.), and organosiloxane polymer KP341 (manufactured by Shin-Etsu Chemical Co., Ltd.). These surfactants may be used singly or in combination of two or more kinds thereof.

When the composition for forming resist underlayer film contains the surfactant, the content thereof is preferably 0.0001 to 10 wt %, and more preferably 0.01 to 5 wt % in the solid content from the viewpoint of improving the coatability of the composition to the semiconductor substrate.

As the light absorber, for example, commercially available light absorbers described in “Kogyoyou Shikiso no Gijyutu to Shijyo (Technology and Market of Industrial Dye)” (CMC Publishing Co., Ltd) and “Senryo Binran (Colorant Handbook)” (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 and the like can be suitably used.

When the light absorber is contained, the content thereof is usually preferably 0.1 to 10 wt %, and more preferably 0.1 to 5 wt % in the solid content.

The rheology modifier is added mainly for the purpose of further improving the fluidity of the composition for forming resist underlayer film, and particularly in a baking step, improving the film thickness uniformity of a resist underlayer film and enhancing the filling properties of the composition for forming resist underlayer film into a hole. Examples of the rheology modifier include phthalic acid derivatives such as dimethyl phthalate, diethyl phthalate, diisobutyl phthalate, dihexyl phthalate, and butyl isodecyl phthalate; adipic acid derivatives such as di-normal-butyl adipate, diisobutyl adipate, diisooctyl adipate, and octyldecyl adipate; maleic acid derivatives such as di-normal-butyl malate, diethyl malate, and dinonyl malate; oleic acid derivatives such as methyl olate, butyl olate, and tetrahydrofurfuryl olate; and stearic acid derivatives such as normal-butyl stearate and glyceryl stearate.

When the composition for forming resist underlayer film contains the rheology modifier, the content thereof is preferably 0.001 to 30 wt %, and more preferably 0.001 to 10 wt % in the solid content from the viewpoint of appropriately improving the fluidity of the composition for forming resist underlayer film.

The adhesion aid is added mainly for the purpose of further improving the adhesion between the composition for forming resist underlayer film and a substrate or a resist to prevent the resist from being peeled off particularly during development. Examples of the adhesion aid include chlorosilanes such as trimethylchlorosilane, dimethylmethylol chlorosilane, methyldiphenylchlorosilane, and chloromethyldimethylchlorosilane; alkoxysilanes such as trimethylmethoxysilane, dimethyldiethoxysilane, methyldimethoxysilane, dimethylmethylol ethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as methyloltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; ureas such as 1,1-dimethylurea and 1,3-dimethylurea; and thiourea compounds.

When the composition for forming resist underlayer film contains the rheology modifier, the content thereof is preferably 0.01 to 5 wt %, and more preferably 0.1 to 2 wt % in the solid content from the viewpoint of further improving the adhesion between the semiconductor substrate or the resist and the underlayer film.

Hereinafter, a resist underlayer film produced using the composition for forming resist underlayer film according to the present invention, a resist pattern forming method, and a method for producing a semiconductor apparatus are described.

An underlayer film according to the present invention can be produced by applying the composition for forming resist underlayer film onto a semiconductor substrate and baking the composition.

Examples of the semiconductor substrate include silicon wafers, germanium wafers, and compound semiconductor wafers composed of as gallium arsenide, indium phosphide, gallium nitride, indium nitride, and aluminum nitride and the like.

The semiconductor substrate that is used may include an inorganic film formed on its surface. Examples of the inorganic film include a polysilicon film, a silicon oxide film, a silicon nitride film, a boro-phospho silicate glass (BPSG) film, a titanium nitride film, a titanium oxynitride film, a tungsten film, a gallium nitride film, and a gallium arsenide film. The inorganic film can be formed on the semiconductor substrate by, for example, an atomic layer deposition (ALD) method, a chemical vapor deposition (CVD) method, a reactive sputtering method, an ion plating method, a vacuum deposition method, or a spin coating method (spin-on-glass: SOG).

The composition for forming resist underlayer film of the present invention is applied onto such a semiconductor substrate by an appropriate application method such as a spinner or a coater. Thereafter, the composition is baked with heating means such as a hot plate to form a resist underlayer film. The baking conditions are appropriately selected from baking temperatures of 100 to 400° C. and baking times of 0.3 to 60 minutes. Preferably, the baking temperature is 120 to 350° C., and the baking time is 0.5 to 30 minutes. More preferably, the baking temperature is 150 to 300° C., and the baking time is 0.8 to 10 minutes. By setting the temperature during baking to be equal to or higher than the lower limit of the above range, the polymer can be sufficiently crosslinked. Meanwhile, by setting the temperature during baking to be equal to or lower than the upper limit of the above range, a good thin film can be formed without the resist underlayer film being decomposed by heat.

The film thickness of the resist underlayer film is, for example, 0.001 μm (1 nm) to 10 μm, preferably 0.002 μm (2 nm) to 1 μm, and more preferably 0.005 μm (5 nm) to 0.5 μm (500 nm).

Next, a photoresist layer is formed on the resist underlayer film. The photoresist layer can be formed by applying a photoresist composition solution onto the underlayer film by a known method, followed by baking.

The photoresist is not particularly limited as long as it is sensitive to light used for exposure. Both a negative type photoresist and a positive type photoresist can be used. Specific examples thereof include a positive type photoresist that contains a novolak resin and 1,2-naphthoquinone diazide sulfonic acid ester, a chemically-amplified type photoresist that contains a binder having a substituent decomposed by an acid to increase an alkali dissolution rate and a photoacid generator, a chemically amplified type photoresist that contains a low molecular compound decomposed by an acid to increase the alkali dissolution rate of the photoresist, an alkali-soluble binder, and a photoacid generator, and a chemically amplified type photoresist that contains a binder having a substituent decomposed by an acid to increase the alkali dissolution rate, a low molecular compound decomposed by an acid to increase the alkali dissolution rate of the photoresist, and a photoacid generator. As the photoresist, commercially available products can be used, and examples thereof include trade name: V146G manufactured by JSR Corporation, trade name: APEX-E manufactured by Shipley Company, trade name: PAR710 manufactured by Sumitomo Chemical Co., Ltd., and trade names AR2772 and SEPR430 manufactured by Shin-Etsu Chemical Co., Ltd. Another examples thereof include fluorine atom-containing polymer-based photoresists as described in Proc. SPIE, Vol. 3999, 330-334 (2000), Proc. SPIE, Vol. 3999, 357-364 (2000), or Proc. SPIE, Vol. 3999, 365-374 (2000).

Next, exposure to light is performed through a predetermined mask. For the exposure to light, for example, i-ray, KrF excimer laser, ArF excimer laser, EUV (extreme ultraviolet ray), or EB (electron beam) can be used.

Next, development is performed with a developer. As a result, for example, when a positive type photoresist is used, the photoresist of the exposed portion is removed, to form a photoresist pattern.

As the developer, an alkaline developer is used, and examples thereof that can be used include aqueous solutions of alkalis including inorganic alkalis such as sodium hydroxide, potassium hydroxide, sodium carbonate, sodium silicate, sodium metasilicate, and aqueous ammonia; first amines such as ethylamine and n-propylamine, and second amines such as diethylamine and di-n-butylamine; third amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. Furthermore, it is also possible to add an appropriate amount of alcohols such as isopropyl alcohol or surfactants such as a nonionic surfactant to the aqueous solutions of alkalis. Among these, a quaternary ammonium salt is preferable, and tetramethylammonium hydroxide and choline are more preferable. Furthermore, a surfactant or the like can also be added to these developers. The conditions for development are appropriately selected from development temperatures of 5 to 50° C. and development times of 10 to 300 seconds.

Next, the resist underlayer layer is dry-etched using the thus-formed resist pattern as a mask. At that time, when the inorganic film is formed on the surface of the used semiconductor substrate, the surface of the inorganic film is exposed, and when the inorganic film is not formed on the surface of the used semiconductor substrate, the surface of the semiconductor substrate is exposed.

EXAMPLES

Hereinafter, the present invention is described in more detail with reference to Examples and Comparative Examples, but the present invention is not limited to the following Examples.

[Measurement of Weight Average Molecular Weight Mw and Polydispersity Mw/Mn]

The Mw and Mw/Mn of each of a crude polymer and a purified polymer were calculated from each peak of a chromatogram obtained by measurement by gel permeation chromatography (GPC) based on a calibration curve. Measurement conditions are as follows.

<Measurement Conditions>

Apparatus: HLC-8320GPC (model number) (manufactured by Tosoh Corporation)

GPC columns: GF-710HQ, GF-510HQ, GF-310HQ (manufactured by Showa Denko K.K.)

Column temperature: 40° C.

Solvent: 0.12 wt % lithium bromide-1-hydrate-dimethylformamide

Flow rate: 1.0 mL/min

Injection amount: 10 μL

Measurement time: 60 minutes

Standard sample: polystyrene (manufactured by Showa Denko K.K.)

Detector: RI

[1] Production of Polymer

Example 1-1

<First Step>

Under a nitrogen atmosphere, 15.0 g (0.082 mol) of barbital (manufactured by HACHIDAI PHARMACEUTICAL CO., LTD.) as a component (b), 23.0 g (0.082 mol) of monoallyl diglycidyl isocyanuric acid (manufactured by Shikoku Chemicals Corporation) as a component (a), 0.93 g (0.00408 mol) of benzyl triethyl ammonium chloride (manufactured by Tokyo Chemical Industry Co., Ltd.), and 155.89 g of propylene glycol monomethyl ether were charged into a 200-mL reaction flask to prepare a raw material solution having a solid content concentration of 20 wt %. Subsequently, this solution was heated to reflux at 130° C., and reacted for 24 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the crude polymer was 10,300, and the Mw/Mn was 5.8.

[Chem. 15]

(b)

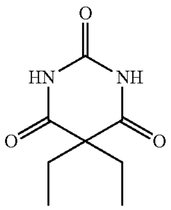

-continued (a)

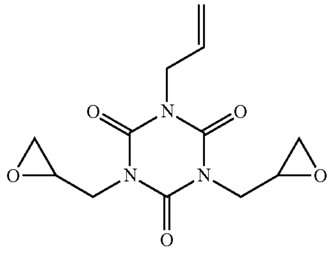

<Second Step>

50 g of the crude polymer solution obtained in the first step was added to 500 g of isopropyl alcohol (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of isopropyl alcohol (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 8.1 g of a desired purified polymer.

As a result of the GPC measurement, the Mw of the obtained purified polymer was 15,600, and the Mw/Mn was 1.9.

Example 1-2

<First step>

Under a nitrogen atmosphere, 15.0 g (0.082 mol) of barbital (manufactured by HACHIDAI PHARMACEUTICAL CO., LTD.) as a component (b), 23.0 g (0.082 mol) of monoallyl diglycidyl isocyanuric acid (manufactured by Shikoku Chemicals Corporation) as a component (a), 0.93 g (0.00408 mol) of benzyl triethyl ammonium chloride (manufactured by Tokyo Chemical Industry Co., Ltd.), and 155.89 g of propylene glycol monomethyl ether were charged into a 200-mL reaction flask to prepare a raw material solution having a solid content concentration of 20 wt %. Subsequently, this solution was heated to reflux at 70° C., and reacted for 24 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the obtained crude polymer was 12,800, and the Mw/Mn was 5.9.

<Second Step>

50 g of the crude polymer solution obtained in the first step was added to 500 g of isopropyl alcohol (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of isopropyl alcohol (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 8.5 g of a desired purified polymer.

As a result of the GPC measurement, the Mw of the obtained purified polymer was 27,000, and the Mw/Mn was 2.1.

Example 1-3

<First Step>

Under a nitrogen atmosphere, 18.1 g (0.098 mol) of barbital (manufactured by HACHIDAI PHARMACEUTICAL CO., LTD.) as a component (b), 23.0 g (0.082 mol) of monoallyl diglycidyl isocyanuric acid (manufactured by Shikoku Chemicals Corporation) as a component (a), 0.93 g (0.00408 mol) of benzyl triethyl ammonium chloride (manufactured by Tokyo Chemical Industry Co., Ltd.), and 167.92 g of propylene glycol monomethyl ether were charged into a 200-mL reaction flask to prepare a raw material solution having a solid content concentration of 20 wt %. Subsequently, this solution was heated to reflux at 130° C., and reacted for 24 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the obtained crude polymer was 4,700, and the Mw/Mn was 3.8.

<Second Step>

50 g of the crude polymer solution obtained in the first step was added to 500 g of isopropyl alcohol (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of isopropyl alcohol (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 7.9 g of a desired purified polymer.

As a result of the GPC measurement, the Mw of the obtained purified polymer was 7,600, and the Mw/Mn was 1.5.

Example 1-4

<First Step>

Under a nitrogen atmosphere, 18.1 g (0.098 mol) of barbital (manufactured by HACHIDAI PHARMACEUTICAL CO., LTD.) as a component (b), 23.0 g (0.082 mol) of monoallyl diglycidyl isocyanuric acid (manufactured by Shikoku Chemicals Corporation) as a component (a), 0.93 g (0.00408 mol) of benzyl triethyl ammonium chloride (manufactured by Tokyo Chemical Industry Co., Ltd.), and 62.97 g of propylene glycol monomethyl ether were charged into a 200-mL reaction flask to prepare a raw material solution having a solid content concentration of 40 wt %. Subsequently, this solution was heated to reflux at 130° C., and reacted for 24 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the obtained crude polymer was 6,400, and the Mw/Mn was 3.6.

<Second Step>

50 g of the crude polymer solution obtained in the first step was added to 500 g of isopropyl alcohol (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of isopropyl alcohol (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 16.9 g of a desired purified polymer.

As a result of the GPC measurement, the Mw of the obtained purified polymer was 10,300, and the Mw/Mn was 1.8.

Example 1-5

<First Step>

Under a nitrogen atmosphere, 14.9 g (0.071 mol) of 3,3'-dithiodipropionic acid (manufactured by Sakai Chemical Industry Co., Ltd., trade name: DTDPA) as a component (b), 20.0 g (0.071 mol) of monoallyl diglycidyl isocyanurate (product name: MA-DGIC manufactured by Shikoku Chemicals Corporation) as a component (a), 1.318 g (0.0071 mol) of ethyltriphenylphosphonium bromide (manufactured by Hokko Chemical Industry Co., Ltd.), and 122.57 g of propylene glycol monomethyl ether were charged into a 300-mL reaction flask to prepare a raw material solution having a solid content concentration of 20 wt %. Subsequently, this solution was heated to reflux at 105° C., and reacted for 24 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the obtained crude polymer was 6,700, and the polydispersity Mw/Mn was 5.4.

[Chem. 16]

(b)

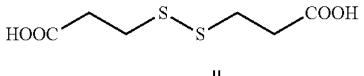

(a)

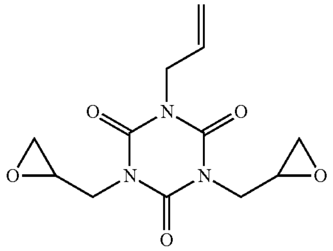

<Second Step>

50 g of the crude polymer solution obtained in the first step was added to 500 g of cyclopentyl methyl ether (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of isopropyl alcohol (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 5.1 g of a desired purified polymer.

As a result of the GPC measurement, the Mw of the obtained purified polymer was 10,000, and the Mw/Mn was 3.8.

Example 1-6

<First Step>

Under a nitrogen atmosphere, 16.5 g (0.071 mol) of phenobarbital (manufactured by HACHIDAI PHARMACEUTICAL CO., LTD.) as a component (b), 20.0 g (0.071 mol) of monoallyl diglycidyl isocyanurate (product name MA-DGIC manufactured by Shikoku Chemicals Corporation) as a component (a), 1.977 g (0.0053 mol) of tetrabutylphosphonium bromide (manufactured by Hokko Chemical Industry Co., Ltd.), and 153.87 g of propylene glycol monomethyl ether were charged into a 300-mL reaction flask to prepare a raw material solution having a solid content concentration of 20 wt %. Subsequently, this solution was heated to reflux at 105° C., and reacted for 24 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the obtained crude polymer was 33,400, and the Mw/Mn was 16.3.

[Chem. 17]

(b)

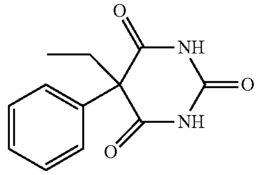

(a)

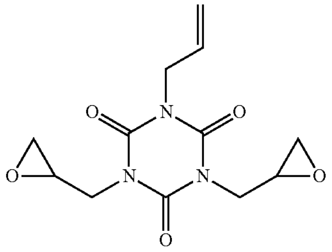

<Second Step>

50 g of the crude polymer solution obtained in the first step was added to 500 g of isopropyl alcohol (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of isopropyl alcohol (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 6.2 g of a desired purified polymer.

As a result of the GPC measurement, the Mw of the obtained purified polymer was 46,200, and the Mw/Mn was 10.5.

Example 1-7

<FIRST Step>

Under a nitrogen atmosphere, 8.24 g (0.071 mol) of fumaric acid (manufactured by Tokyo Chemical Industry Co., Ltd.) as a component (b), 20.0 g (0.071 mol) of monoallyl diglycidyl isocyanurate (product name: MA-DGIC manufactured by Shikoku Chemicals Corporation) as a component (a), 1.617 g (0.0071 mol) of benzyltriethylammonium chloride (manufactured by Tokyo Chemical Industry Co., Ltd.), and 122.57 g of propylene glycol monomethyl ether were charged into a 300-mL reaction flask to prepare a raw material solution having a solid content concentration of 20 wt %. Subsequently, this solution was heated to reflux at 120° C., and reacted for 8 hours to obtain a crude polymer solution. To the obtained crude polymer solution, each of a cation exchange resin (product name: DOWEX [registered trademark] 550A, Muromachi Technos Co., Ltd.), and an anion exchange resin (product name: Amberlite [registered trademark] 15JWET, Organo Corporation) was added in the same amount as that of the solid content of the raw material solution, followed by performing an ion exchange treatment at room temperature for 4 hours to remove unreacted monomer components and a catalyst used in the reaction. The resulting crude polymer solution was subjected to GPC measurement and a second step.

As a result of the GPC measurement, the Mw of the obtained crude polymer was 4,600, and the Mw/Mn was 3.1.

[Chem. 18]

(b)

(a)

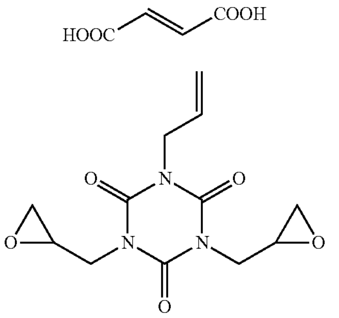

<Second Step>

50 g of the crude polymer solution obtained in the first step was added to 500 g of cyclopentyl methyl ether (10 mass times per the reaction liquid) adjusted to 25° C. over 30 minutes to re-precipitate the crude polymer, followed by stirring for additional 30 minutes. The obtained sediment was subjected to suction filtration under reduced pressure using a Kiriyama funnel (40 ϕ) and filter paper (5A). The obtained sediment was dissolved again in 50 g of propylene glycol monomethyl ether. The obtained polymer solution was added to 500 g of cyclopentyl methyl ether (10 mass times per the reaction liquid) over 30 minutes to re-precipitate the polymer, followed by stirring for additional 30 minutes. The obtained sediment was subjected to suction filtration under reduced pressure using a Kiriyama funnel (40 ϕ) and filter paper (5A). The resultant was dried at 60° C. using a vacuum dryer to obtain 4.9 g of a desired purified polymer.

As a result of the GPC measurement, the Mw of the obtained purified polymer was 5,100, and the Mw/Mn was 2.9.

<Reduction Rate of Low Molecular Weight Component>

In Examples 1-1 to 1-7, the effect of carrying out the second step was examined by comparing the content rates of low molecular weight components having an Mw of 1,000 or less contained in the crude polymer and the purified polymer.

The content rate of the low molecular weight component and the reduction rate thereof were calculated by the following procedure.

(1) Content Rate of Low Molecular Weight Component

In a GPC graph with a horizontal axis representing an elution time and a vertical axis representing detection intensity, a value obtained by integrating a region with an Mw of 1,000 or less in terms of standard polystyrene (PS) is divided by the integral value of the entire region to calculate the content rate of the low molecular weight component.

(2) Reduction Rate of Low Molecular Weight Component

From the content rate of the low molecular weight component obtained in the above (1), the reduction rate of the low molecular weight component was calculated by the following formula.

[1−(Content rate of low molecular weight component of purified polymer/content rate of low molecular weight component of crude polymer)]×100(wt %)

The results are shown in Table 1.

TABLE 1

| | Mw | | Content rate of low molecular weight component (wt %) | | Reduction rate of low molecular weight component (wt %) |
|---|---|---|---|---|---|
| | Crude polymer | Purified polymer | Crude polymer | Purified polymer | |
| Example 1-1 | 10,300 | 15,600 | 18.0 | 0.3 | 98.3 |
| Example 1-2 | 12,800 | 27,000 | 14.5 | 0.1 | 99.3 |
| Example 1-3 | 4,700 | 7,600 | 23.7 | 0.6 | 97.5 |
| Example 1-4 | 6,400 | 10,300 | 14.2 | 0.7 | 95.1 |
| Example 1-5 | 6,700 | 10,000 | 27.3 | 9.1 | 66.7 |
| Example 1-6 | 33,400 | 46,200 | 17.4 | 3.8 | 78.2 |
| Example 1-7 | 4,600 | 5,100 | 20.5 | 9.3 | 54.6 |

[2] Preparation of Composition for Forming Resist Underlayer Film

Example 2-1

To 0.97 g of the purified polymer obtained in Example 1-1, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-2

To 0.97 g of the purified polymer obtained in Example 1-1, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-3

To 0.97 g of the purified polymer obtained in Example 1-2, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-4

To 0.97 g of the purified polymer obtained in Example 1-2, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-5

To 0.97 g of the purified polymer obtained in Example 1-3, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-6

To 0.97 g of the purified polymer obtained in Example 1-3, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-7

To 0.97 g of the purified polymer obtained in Example 1-4, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-8

To 0.97 g of the purified polymer obtained in Example 1-4, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-9

To 0.97 g of the purified polymer obtained in Example 1-5, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-10

To 0.97 g of the purified polymer obtained in Example 1-5, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-11

To 0.97 g of the purified polymer obtained in Example 1-6, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-12

To 0.97 g of the purified polymer obtained in Example 1-6, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-13

To 0.97 g of the purified polymer obtained in Example 1-7, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Example 2-14

To 0.97 g of the purified polymer obtained in Example 1-7, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 69.13 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-1

To 4.86 g of the crude polymer solution obtained in the first step of Example 1-1, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-2

To 4.86 g of the crude polymer solution obtained in the first step of Example 1-1, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-3

To 4.86 g of the crude polymer solution obtained in the first step of Example 1-2, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-4

To 4.86 g of the crude polymer solution obtained in the first step of Example 1-2, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-5

To 4.86 g of the crude polymer solution obtained in the first step of Example 1-3, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-6

To 4.86 g of the crude polymer solution obtained in the first step of Example 1-3, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-7

To 4.86 g of the crude polymer solution obtained in the first step of Example 1-4, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-8

To 4.86 g of the crude polymer solution obtained in the first step of Example 1-4, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-9

To 4.86 g of the crude polymer solution obtained in the first step of Example 1-5, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-10

To 4.86 g of the crude polymer solution obtained in the first step of Example 1-5, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-11

To 4.86 g of the crude polymer solution obtained in the first step of Example 1-6, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-12

To 4.86 g of the crude polymer solution obtained in the first step of Example 1-6, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-13

To 4.86 g of the crude polymer solution obtained in the first step of Example 1-7, 0.24 g of tetramethoxymethyl glycoluril (Nihon Cytec Industries, Inc., trade name: POWDERLINK [registered trademark] 1174), 0.024 g of p-phenol sulfonic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

Comparative Example 1-14

To 4.86 g of the crude polymer solution obtained in the first step of Example 1-7, 0.24 g of tetramethoxymethyl glycoluril (Nihon Cytec Industries, Inc., trade name: POWDERLINK [registered trademark] 1174), 0.024 g of 5-sulfosalicylic acid (Tokyo Chemical Industry Co., Ltd.), 65.24 g of propylene glycol monomethyl ether, and 29.63 g of propylene glycol monomethyl ether acetate were added to form a solution. Thereafter, the solution was filtered using a polyethylene microfilter having a pore size of 0.01 μm to prepare a composition for forming resist underlayer film.

The polymers and acid catalysts used in Examples 2-1 to 2-14 and Comparative Examples 1-1 to 1-14 are listed in the following Tables 2 and 3.

Abbreviations shown in Table 1 are as follows.

PSA: p-phenolsulfonic acid

5-SSA: 5-sulfosalicylic acid

TABLE 2

| | Polymer | Mw | Mw/Mn | Acid catalyst |
|---|---|---|---|---|
| Example 2-1 | Example 1-1 | 15,600 | 1.9 | PSA |
| Example 2-2 | | | | 5-SSA |
| Example 2-3 | Example 1-2 | 27,000 | 2.1 | PSA |
| Example 2-4 | | | | 5-SSA |
| Example 2-5 | Example 1-3 | 7,600 | 1.5 | PSA |
| Example 2-6 | | | | 5-SSA |
| Example 2-7 | Example 1-4 | 10,300 | 1.8 | PSA |
| Example 2-8 | | | | 5-SSA |
| Example 2-9 | Example 1-5 | 10,000 | 3.8 | PSA |
| Example 2-10 | | | | 5-SSA |
| Example 2-11 | Example 1-6 | 46,200 | 10.5 | PSA |
| Example 2-12 | | | | 5-SSA |
| Example 2-13 | Example 1-7 | 5,100 | 2.9 | PSA |
| Example 2-14 | | | | 5-SSA |

TABLE 3

| | Polymer | Mw | Mw/Mn | Acid catalyst |
|---|---|---|---|---|
| Comparative Example 1-1 | Example 1-1 | 10,300 | 5.8 | PSA |
| Comparative Example 1-2 | (Crude polymer) | | | 5-SSA |
| Comparative Example 1-3 | Example 1-2 | 12,800 | 5.9 | PSA |
| Comparative Example 1-4 | (Crude polymer) | | | 5-SSA |
| Comparative Example 1-5 | Example 1-3 | 4,700 | 3.8 | PSA |
| Comparative Example 1-6 | (Crude polymer) | | | 5-SSA |
| Comparative Example 1-7 | Example 1-4 | 6,400 | 3.6 | PSA |
| Comparative Example 1-8 | (Crude polymer) | | | 5-SSA |
| Comparative Example 1-9 | Example 1-5 | 6,700 | 5.4 | PSA |
| Comparative Example 1-10 | (Crude polymer) | | | 5-SSA |
| Comparative Example 1-11 | Example 1-6 | 33,400 | 16.3 | PSA |
| Comparative Example 1-12 | (Crude polymer) | | | 5-SSA |
| Comparative Example 1-13 | Example 1-7 | 4,600 | 3.1 | PSA |
| Comparative Example 1-14 | (Crude polymer) | | | 5-SSA |

<Measurement of Amount of Sublimate>

The composition for forming resist underlayer film prepared in each of Examples 2-1 to 2-14 and Comparative Examples 1-1 to 1-14 was applied to a silicon wafer substrate having a diameter of 4 inches by a spin coater at 1,500 rpm for 60 seconds. The wafer to which the composition for forming resist underlayer film was applied was set in a sublimate amount measurement apparatus integrated with a hot plate (see WO 2007/111147), and baked for 120 seconds, thereby collecting a sublimate on a QCM (quartz crystal microbalance) sensor, that is, a quartz oscillator having an electrode. The QCM sensor can measure a minute change in mass by utilizing its property that the deposition of the sublimate on the surface (electrode) of the quartz oscillator causes a change (decrease) in the frequency of the quartz oscillator in accordance with the mass of the sublimate.

A detailed measurement procedure is as follows. The hot plate of the sublimate amount measurement apparatus was heated to 205° C., and the flow rate of a pump was set to 1 $m^3/s$. The apparatus was left to stand for the first 60 seconds for stabilizing the apparatus. Immediately thereafter, the wafer coated with the resist underlayer film was quickly placed on the hot plate through a sliding opening, and the sublimate generated from 60 seconds to 120 seconds after the placement (during 60 seconds) was collected. The initial film thickness of the resist underlayer film formed on the wafer was 35 nm.

A flow attachment (detection portion) connecting the QCM sensor of the sublimate amount measuring apparatus and a collection funnel portion was used without attachment of a nozzle. Therefore, a gas is inflowed without being narrowed from a flow path (diameter: 32 mm) of a chamber unit having a distance from the sensor (quartz oscillator) of 30 mm. An electrode of the QCM sensor was formed of a material containing silicon and aluminum as principal components (AlSi). In the QCM sensor used, the diameter of the quartz oscillator (sensor diameter) was 14 mm; the diameter of the electrode on the surface of the quartz oscillator was 5 mm; and the resonance frequency was 9 MHz.

The obtained frequency change was converted to gram from the eigenvalue of the quartz oscillator used for the measurement, thereby clarifying the amount of the sublimate from one wafer coated with the resist underlayer film. The results are shown in Table 4.

In Table 4, X represents a resist underlayer film formed of a composition containing the crude polymer synthesized in the first step, and Y represents a resist underlayer film formed of a composition containing the purified polymer purified in the second step. In Table 4, the influence of the presence or absence of a purification step due to re-precipitation on the sublimate can also be confirmed.

TABLE 4

| Y | X | Amount of sublimate of Y/ amount of sublimate of X |
|---|---|---|
| Example 2-1 | Comparative Example 1-1 | 0.55 |
| Example 2-2 | Comparative Example 1-2 | 0.43 |
| Example 2-3 | Comparative Example 1-3 | 0.60 |
| Example 2-4 | Comparative Example 1-4 | 0.61 |
| Example 2-5 | Comparative Example 1-5 | 0.25 |
| Example 2-6 | Comparative Example 1-6 | 0.23 |
| Example 2-7 | Comparative Example 1-7 | 0.51 |
| Example 2-8 | Comparative Example 1-8 | 0.53 |
| Example 2-9 | Comparative Example 1-9 | 0.46 |
| Example 2-10 | Comparative Example 1-10 | 0.44 |
| Example 2-11 | Comparative Example 1-11 | 0.87 |
| Example 2-12 | Comparative Example 1-12 | 0.80 |
| Example 2-13 | Comparative Example 1-13 | 0.32 |
| Example 2-14 | Comparative Example 1-14 | 0.33 |

From the above, in the resist underlayer films (Examples 2-1 to 2-14) obtained from the composition for forming resist underlayer film containing the purified polymer having a reduced low molecular weight component content, as a result, the generation of the sublimate was further suppressed as compared with the resist underlayer films (Comparative Examples 1-1 to 1-14) obtained from the composition for forming resist underlayer film containing the crude polymer.

The invention claimed is:

1. A composition for forming resist underlayer film comprising:

a polymer having a repeating unit having the following formula (1-1) or (1-3); and an organic solvent, wherein a content of a low molecular weight component having a weight average molecular weight of 1,000 or less derived from the polymer is 10 wt % or less, wherein the polymer is obtained by a method comprising a first step of reacting any of monomers having the following formula (a) with a monomer selected from the monomers of formulae (b) in the presence of a quaternary phosphonium salt or a quaternary ammonium salt in an organic solvent to synthesize a crude polymer having a repeating unit having the following formula (1-1) or (1-3), and then, adding cation exchange resin and anion exchange resin to the obtained crude polymer solution to perform ion exchange treatment; and a second step of mixing a solution containing the crude polymer obtained in the first step with a poor solvent, then precipitate a purified polymer having the repeating unit having the formula (1-1) or (1-3), and filtering the polymer;

wherein 54.6 wt % or more of a low molecular weight component having a weight average molecular weight of 1,000 or less is removed from the crude polymer by the second step:

(1-1)

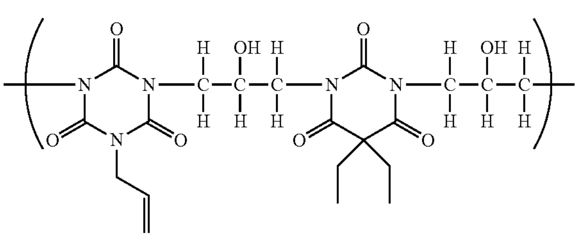

(1-3)

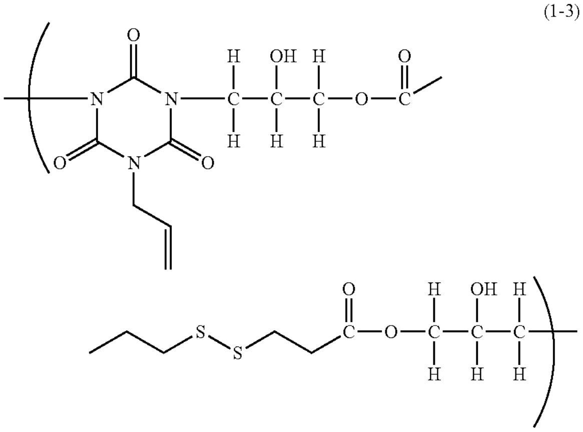

(a)

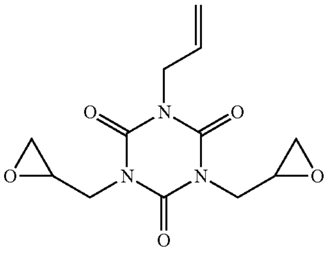

(b)

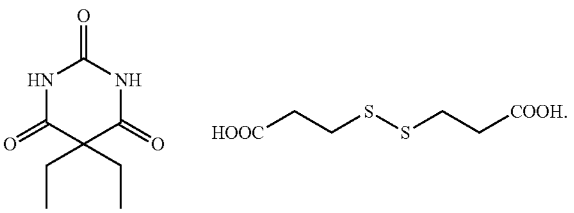

2. The composition for forming resist underlayer film according to claim 1, further comprising a crosslinking agent.

3. The composition for forming resist underlayer film according to claim 1, further comprising an acid catalyst.

4. A resist underlayer film obtained from the composition for forming resist underlayer film according to claim 1.

5. The composition for forming resist underlayer film according to claim 1, wherein a content of a low molecular weight component having a weight average molecular weight of 1,000 or less in the polymer is 5 wt % or less.

6. The composition for forming resist underlayer film according to claim 1, wherein a content of a low molecular weight component having a weight average molecular weight of 1,000 or less in the polymer is 3 wt % or less.

7. The composition for forming resist underlayer film according to claim 1, wherein a content of a low molecular weight component having a weight average molecular weight of 1,000 or less in the polymer is 1 wt % or less.

8. A polymer having a repeating unit having the following formula (1-1) or (1-3), wherein a content of a low molecular weight component having a weight average molecular weight of 1,000 or less derived from the polymer is 10 wt % or less, wherein the polymer is obtained by a method comprising a first step of reacting any of monomers having the following formula (a) with a monomer selected from the monomers of formulae (b) in the presence of a quaternary phosphonium salt or a quaternary ammonium salt in an organic solvent to synthesize a crude polymer having a repeating unit having the following formula (1-1) or (1-3), and then, adding cation exchange resin and anion exchange resin to the obtained crude polymer solution to perform ion exchange treatment; and a second step of mixing a solution containing the crude polymer obtained in the first step with a poor solvent, then precipitate a purified polymer having the repeating unit having the formula (1-1) or (1-3), and filtering the polymer;

wherein 54.6 wt % or more of a low molecular weight component having a weight average molecular weight of 1,000 or less is removed from the crude polymer by the second step:

(1-1)

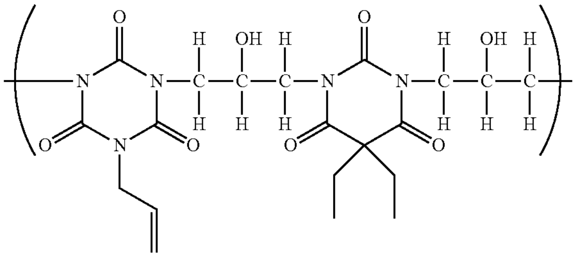

(1-3)

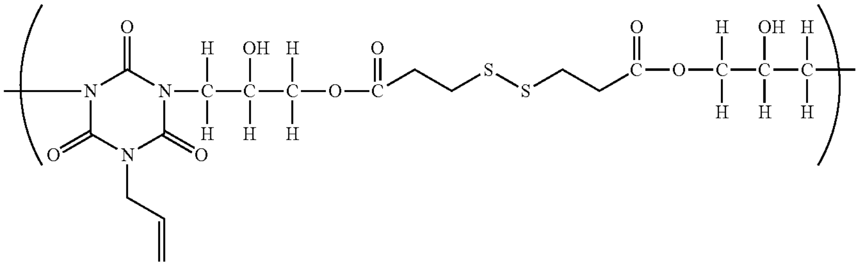

(a)

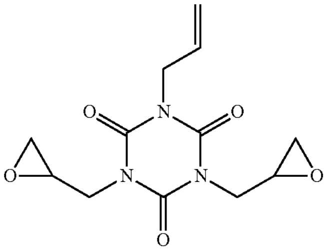

(b)

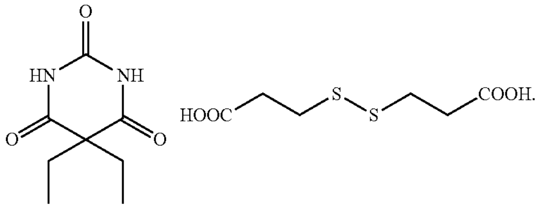

9. The polymer according to claim 8, wherein the content of a low molecular weight component having a weight average molecular weight of 1,000 or less in the polymer is 5 wt % or less.

10. The polymer according to claim 8, wherein the content of a low molecular weight component having a weight average molecular weight of 1,000 or less in the polymer is 3 wt % or less.

11. The polymer according to claim 8, wherein the content of a low molecular weight component having a weight average molecular weight of 1,000 or less in the polymer is 1 wt % or less.

* * * * *